United States Patent
Tang et al.

(10) Patent No.: US 10,325,659 B1
(45) Date of Patent: Jun. 18, 2019

(54) I/O BUFFER OFFSET MITIGATION

(71) Applicant: MICRON TECHNOLOGY, INC., Boise, ID (US)

(72) Inventors: Qiang Tang, Cupertino, CA (US); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/864,069

(22) Filed: Jan. 8, 2018

(51) Int. Cl.
| H03K 19/0185 | (2006.01) |
|---|---|
| G11C 16/10 | (2006.01) |
| G11C 16/04 | (2006.01) |
| H03K 19/00 | (2006.01) |
| G11C 16/26 | (2006.01) |

(52) U.S. Cl.
CPC .......... *G11C 16/10* (2013.01); *G11C 16/0483* (2013.01); *G11C 16/26* (2013.01); *H03K 19/0005* (2013.01); *H03K 19/018528* (2013.01)

(58) Field of Classification Search
CPC ..... G11C 16/10; G11C 16/0483; G11C 16/26; G11C 16/06; H03K 19/0005; H03K 19/018528
See application file for complete search history.

(56) References Cited

U.S. PATENT DOCUMENTS

| 4,760,286 A | 7/1988 | Pigott |
| 4,827,222 A | 5/1989 | Hester et al. |
| 5,596,297 A | 1/1997 | McClure et al. |
| 7,262,651 B2 | 8/2007 | Kwon |
| 2007/0103208 A1* | 5/2007 | Huang ............ H03F 3/217 327/108 |
| 2009/0302888 A1 | 12/2009 | Shumarayev et al. |
| 2009/0302923 A1 | 12/2009 | Smeloy et al. |
| 2010/0231300 A1 | 9/2010 | Dimitriu |
| 2011/0309475 A1* | 12/2011 | Lee ............ G11C 5/025 257/532 |
| 2013/0214843 A1* | 8/2013 | Ha ............ H03K 19/018514 327/333 |
| 2015/0371691 A1* | 12/2015 | Song ............ G11C 7/1084 365/189.05 |

\* cited by examiner

*Primary Examiner* — Harry W Byrne
*Assistant Examiner* — Sultana Begum
(74) *Attorney, Agent, or Firm* — Dicke, Billig & Czaja, PLLC

(57) ABSTRACT

Methods of operating an integrated circuit device, and integrated circuit devices configured to perform methods, including applying a particular voltage level to a first input of an input/output (I/O) buffer and to a second input of the I/O buffer, determining whether the I/O buffer is deemed to exhibit offset, and applying an adjustment to the I/O buffer offset while applying the particular voltage level to the first input of the I/O buffer and to the second input of the I/O buffer if the I/O buffer is deemed to exhibit offset.

5 Claims, 16 Drawing Sheets

I/O BUFFER OFFSET MITIGATION

TECHNICAL FIELD

The present disclosure relates generally to integrated circuit architecture and operation, and, in particular, in one or more embodiments, the present disclosure relates to input or output (I/O) buffer offset mitigation.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Input or output buffers are commonly used in integrated circuit devices to condition received data or strobe signals so as to provide output signals having well-defined logic levels, either for internal use or for transmission to external devices. Such buffers generally include some form of differential amplifier responsive to two input voltage signals, such as complementary strobe signals, or a data signal and a reference voltage. In an ideal situation, a differential amplifier will operate to transition its output voltage signal when the two input voltage signals cross, e.g., when they are equal. However, variabilities inherent in typical integrated circuit fabrication, or imbalances in signal termination impedance, may result in a voltage offset, such that the buffer may transition its output voltage signal at a point other than when the two input voltage signals are equal. Such behavior can be a significant error source surrounding setup and hold time requirements for the buffer.

DETAILED DESCRIPTION

Figure 1:
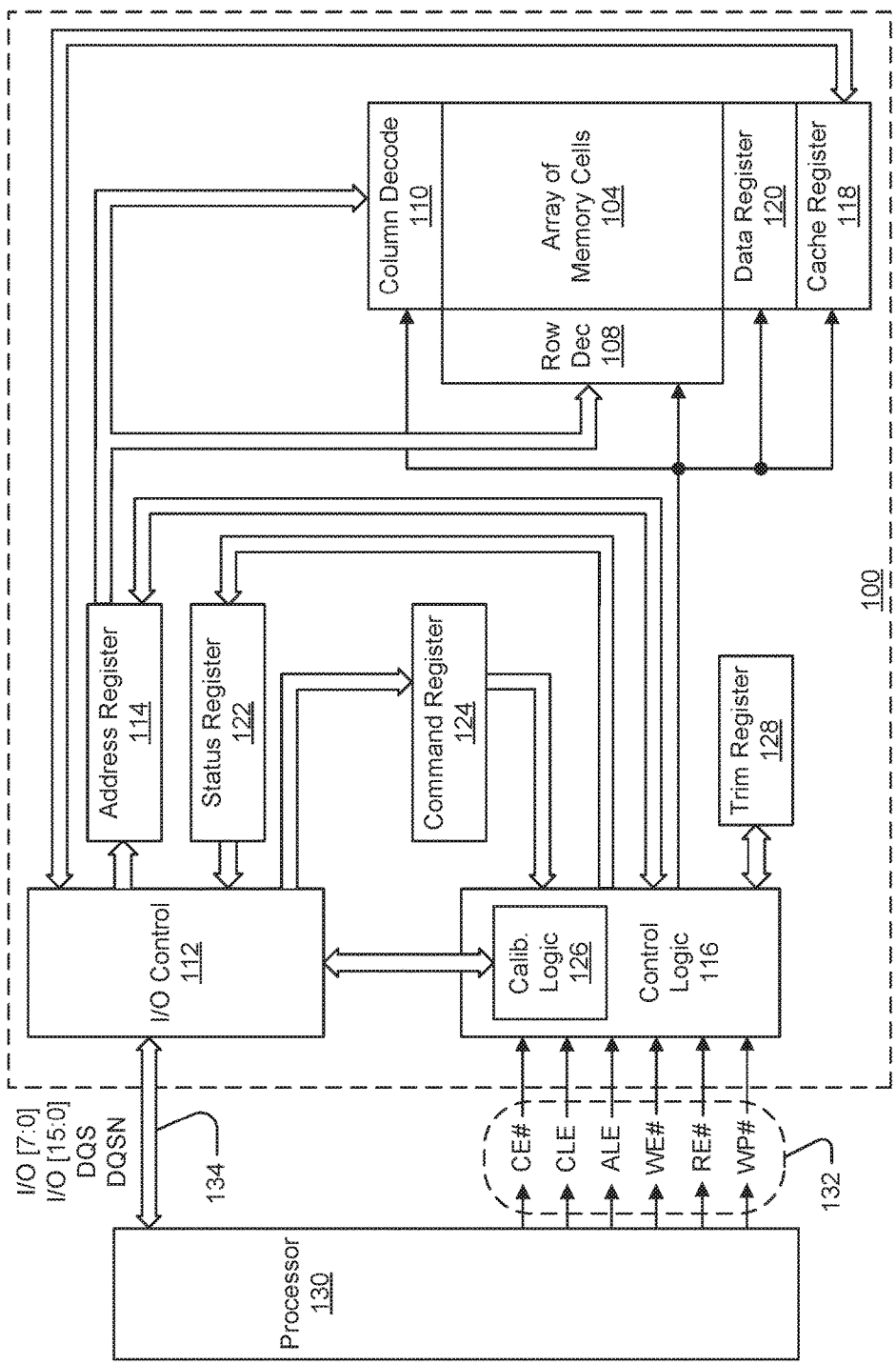
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

Various embodiments will be discussed using the example of an input buffer of a memory device. However, it should be understood that the concepts disclosed herein may also be applied to an output buffer, as well as to other forms of integrated circuit devices.

Input buffer offset can be a significant error source surrounding setup and hold time requirements of the buffer. The setup time ($t_{DS}$) may be defined as the minimum time in advance of the latching clock (e.g., a data strobe) edge that valid data must be present at the buffer's input. The hold time ($t_{DH}$) may be defined as the minimum time following the latching clock edge that the data must be present at the input buffer's input. Together, the setup and hold times define a "window" surrounding the clock edge (rising and/or falling) during which the data on the data line (DQ) must be valid. The values of $t_{DS}$ and $t_{DH}$ are often defined by industry, customer or internal standards, typically as minimum periods of time. Integrated circuit devices are typically designed to operate with a margin, or additional time, beyond each of these standards. However, variabilities inherent in typical integrated circuit fabrication, or imbalances in signal termination impedance, may result in a voltage offset of the input buffer, which can contribute to loss of $t_{DS}/t_{DH}$ margin, and may lead to a failure to operate within these standards. Various embodiments facilitate mitigation of buffer offset by applying an adjustment to an I/O buffer, while particular voltage levels are applied to first and second inputs of the I/O buffer, until a logic level of the output of the I/O buffer transitions. Actively applying particular (e.g., known) voltage levels to the inputs of the I/O buffer while applying the adjustment may facilitate improvements in buffer offset mitigation. For example, by selecting voltage levels near (e.g., equal to) a desired transition point of the I/O buffer, buffer offset under normal operating conditions may be more effectively mitigated.

FIG. 1 is a simplified block diagram of a first apparatus (e.g., an integrated circuit device), in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. Calibration logic 126 may be a component of the control logic 116, and may be in communication with the I/O control circuitry 112. The calibration logic 126 (e.g., a controller, such as a state machine) may perform methods in accordance with embodiments for the calibration of I/O buffer circuits (not shown in FIG. 1) of the I/O control circuitry 112. Although depicted as a portion of the control logic 116, the calibration logic 126 may represent a separate control logic. A trim register 128 may be in communication with the control logic 116 to store trim settings, e.g., received responsive to the calibration logic 126. Although depicted as a separate storage register, trim register 128 may represent a portion of the array of memory cells 104. Trim settings are generally values used by an integrated circuit device to define values of voltages, control signals, timing, quantities, etc. to be used during operation of that integrated circuit device.

A controller (e.g., the control logic 116 internal to the memory device 100) controls access to the array of memory cells 104 in response to the commands and generates status information for the external processor 130, i.e., control logic 116 is configured to perform access operations (e.g., read operations, program operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 may also be in communication with a cache register 118. Cache register 118 may latch data, either incoming or outgoing, as directed by control logic 116 to temporarily store data while the array of memory cells 104 is busy writing or reading, respectively, other data. During a program operation (e.g., write operation), data may be passed from the cache register 118 to data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may be written into command register 124. The addresses may be received over input/output (I/O) pins [7:0] of I/O bus 134 at I/O control circuitry 112 and may be written into address register 114. The data may be received over input/output (I/O) pins [7:0] for an 8-bit device or input/output (I/O) pins [15:0] for a 16-bit device at I/O control circuitry 112 and may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. The I/O bus 134 might further include complementary data strobes DQS and DQSN that may provide a synchronous reference for data input and output. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
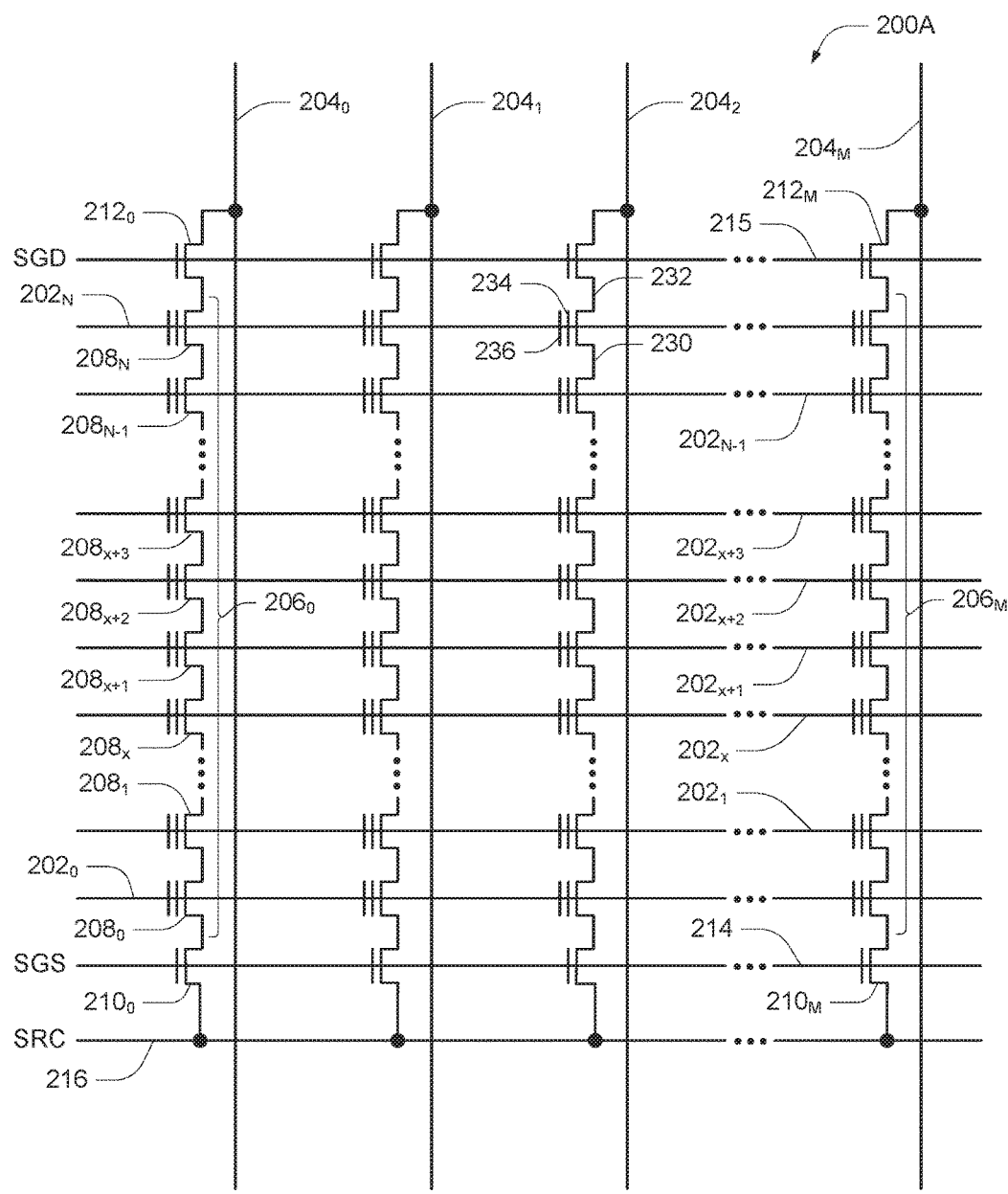
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
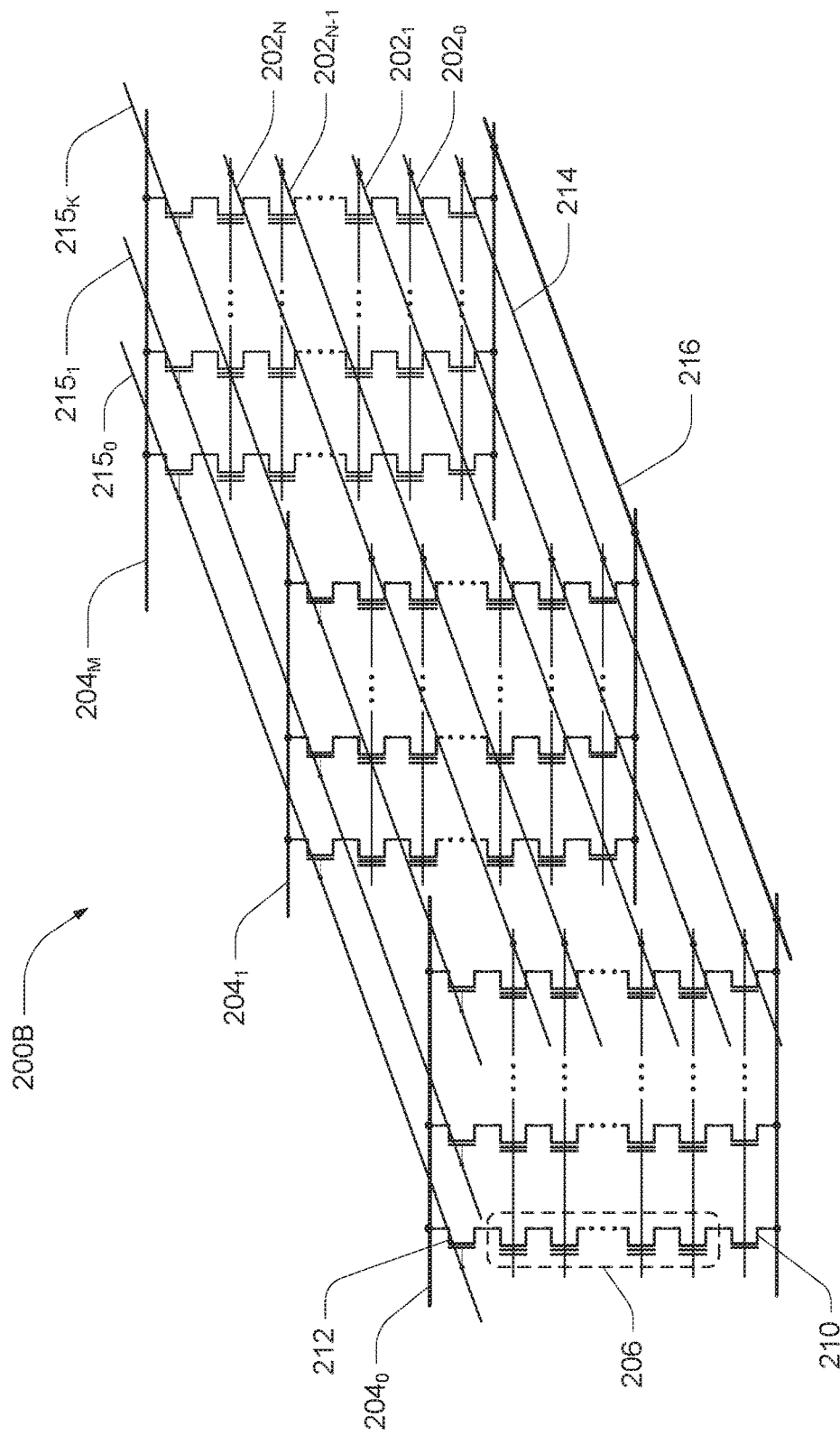

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3A:
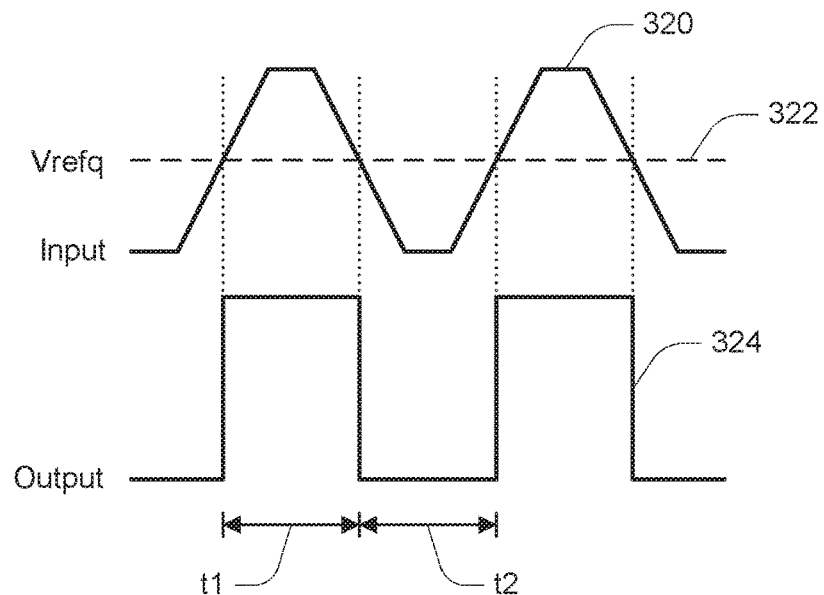
FIG. 3A is a generic wave diagram demonstrating input buffer behavior without offset.

FIG. 3A is a generic wave diagram demonstrating I/O buffer (e.g., an input buffer) behavior without offset. In FIG. 3A, the input 320 may represent a first input voltage signal of the I/O buffer while the reference voltage Vrefq 322 may represent a second input voltage signal of the I/O buffer. The reference voltage Vrefq may be received from an external device or it may be generated internally to the integrated circuit device containing the I/O buffer. The output 324 may represent the output voltage signal of the I/O buffer, transitioning at each crossing of the input 320 and Vrefq 322. This provides for I/O buffer behavior where the time t1 is equal to the time t2 when the input 320 behaves as a symmetrical clock signal.

Figure 3B:
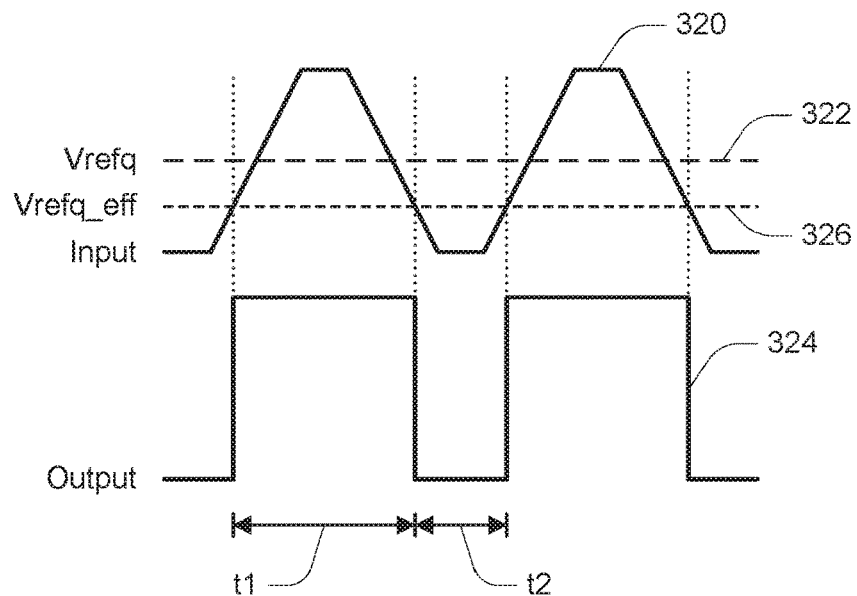
FIG. 3B is a generic wave diagram demonstrating input buffer behavior with offset.

FIG. 3B is a generic wave diagram demonstrating I/O buffer (e.g., an input buffer) behavior with offset. When offset exists the output 324 may not transition when the input 320 and Vrefq 322 cross, but may instead transition at a crossing of the input 320 and an effective reference voltage Vrefq_eff 326. With the same behavior of the input 320 as in FIG. 3A, the time t1 is no longer equal to the time t2. Various embodiments seek to mitigate such I/O buffer offset. For example, various embodiments might determine and/or apply corrections to the I/O buffer to reduce this offset, e.g., to reduce the difference between values of Vrefq 322 and Vrefq_eff 326.

Figure 4A:
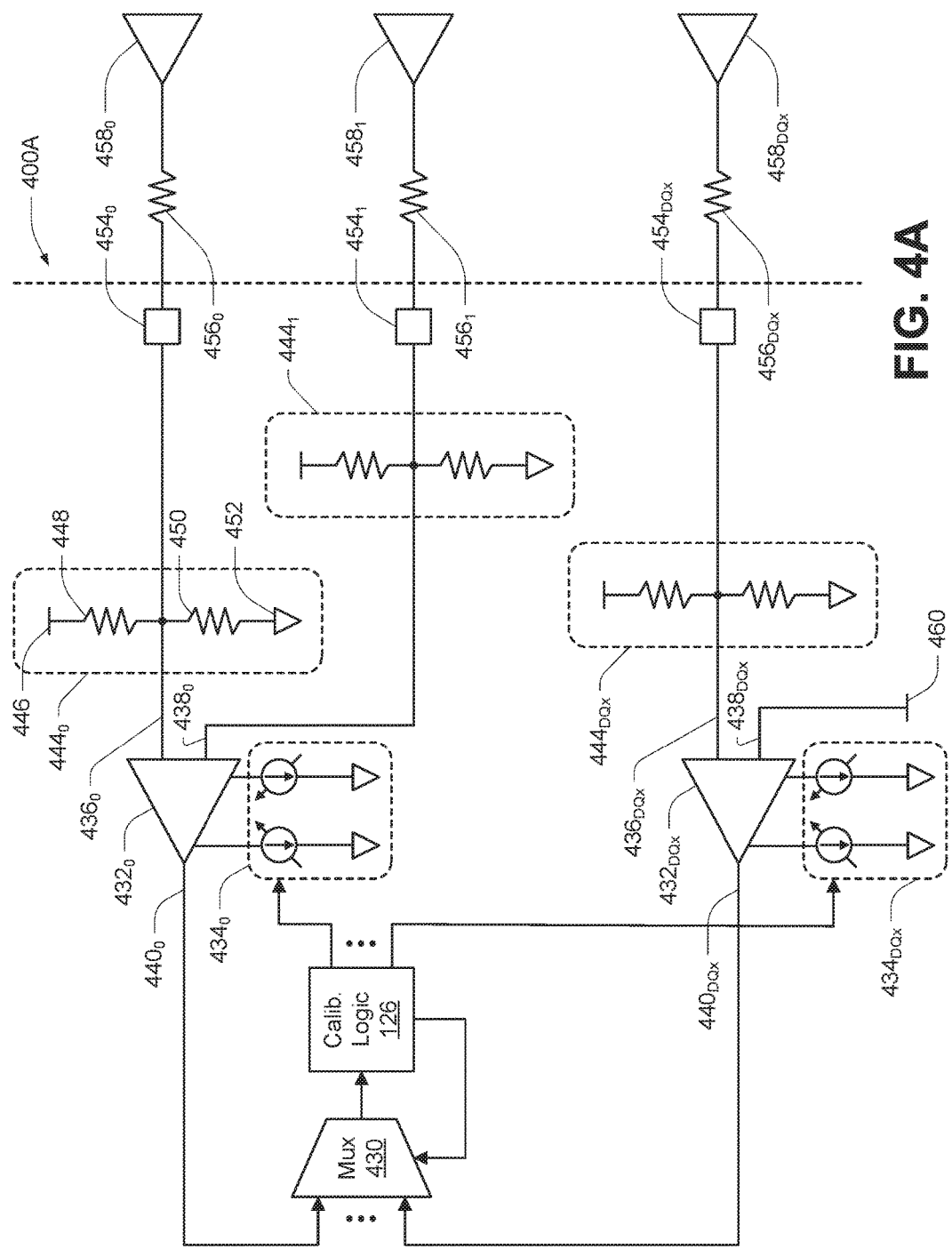
FIG. 4A is a block schematic of a portion of an integrated circuit device utilizing on-die termination in accordance with an embodiment.

FIG. 4A is a block schematic of a portion of an integrated circuit device 400A (e.g., a memory device) utilizing on-die termination (ODT) in accordance with an embodiment. The integrated circuit device 400A includes an input buffer $432_0$ having an output $440_0$. The output $440_0$ might be selectively connected (not depicted in FIG. 4A) to the cache register 118, for example, to provide data strobe signals from I/O control circuitry 112 for providing timing signals for use in storing data to the array of memory cells 104. The input buffer $432_0$ may have a first input $436_0$ configured to connect to a conductive node $454_0$ (e.g., conductive pad or other electrical connection for an external device) through an ODT device $444_0$. The ODT device $444_0$ is represented as a pull-up resistance 448 (e.g., a pull-up termination device) and a pull-down resistance 450 (e.g., a pull-down termination device) connected between a voltage node 446 (e.g., configured to receive a top rail supply voltage such as Vcc) and a voltage node 452 (e.g., configured to receive a bottom rail reference potential such as Vss or ground). While typical configurations of ODT will often utilize multiple pull-up or pull-down resistances selectively connected in parallel (compare FIG. 3 of U.S. Patent Application Publication No. 2016/0259385 A1 to Q. Tang) to facilitate calibration (e.g., ZQ calibration) to a desired impedance, the configuration of the ODT device 444 (e.g., ODT device $444_0$) is not important to the disclosed embodiments. For example, the ODT device 444 might represent any circuit configuration intended for use in impedance matching of transmission lines, e.g., as measured at a conductive node 454 or other electrical connection for an external device.

The input buffer $432_0$ may further include a second input $438_0$ configured to connect to a conductive node $454_1$ (or other electrical connection for an external device) through ODT device $444_1$. The ODT device $444_1$ may have a configuration similar to (e.g., the same as) the ODT device $444_0$, although resistance values of the pull-up resistance 448 and the pull-down resistance 450 may be different, either by design (e.g., as a result of ZQ calibration) or as a result of variability in fabrication.

The conductive nodes $454_0$ and $454_1$ might represent physical contacts for receiving signals of the I/O bus 134 of FIG. 1, for example. As a particular example, the conductive nodes $454_0$ and $454_1$ might be configured to receive complementary data strobes DQS and DQSN. In this example, the driver $458_0$ may represent a driver of the processor 130 providing the DQS signal, and the driver $458_1$ may represent a driver of the processor 130 providing the DQSN signal, while the resistances $456_0$ and $456_1$ may represent impedances of the signal path between their respective driver $458_0$ or $458_1$, and the corresponding conductive nodes $454_0$ or $454_1$, respectively.

The integrated circuit device 400A may further include an input buffer $432_{DQx}$ having an output $440_{DQx}$. The output $440_{DQx}$ might be selectively connected (not depicted in FIG. 4A) to the cache register 118, for example, to provide data signals from I/O control circuitry 112 for use in storing data to the array of memory cells 104. The input buffer $432_{DQx}$ may further have a first input $436_{DQx}$ configured to connect to a conductive node $454_{DQx}$ (or other electrical connection for an external device) through ODT device $444_{DQx}$. The ODT device $444_{DQx}$ may have a configuration similar to (e.g., the same as) the ODT device $444_0$, although resistance values of the pull-up resistance 448 and the pull-down resistance 450 may be different, either by design (e.g., as a result of ZQ calibration) or as a result variability in fabrication. The input buffer $432_{DQx}$ may further include a second input $438_{DQx}$ configured to connect (e.g., during normal operation of the input buffer $432_{DQx}$) to a voltage node 460 that is configured to receive a reference voltage such as Vrefq. The reference voltage Vrefq might, as an example, have a voltage level halfway between a voltage level of the voltage node 446 and a voltage level of the voltage node 452, e.g., Vcc/2. The reference voltage Vrefq might be received from an external device, or it might be generated internal to the integrated circuit device 400A.

The conductive node $454_{DQx}$ might represent a physical contact for receiving a signal of the I/O bus 134 of FIG. 1, for example. As a particular example, the conductive node $454_{DQx}$ might be configured to receive a data (DQ) signal, e.g., a signal representative of a digit of data. In this example, the driver $458_{DQx}$ may represent a driver of the processor 130 providing that DQ signal, while the resistance $456_{DQx}$ may represent an impedance of the signal path between the driver $458_{DQx}$ and the conductive node $454_{DQx}$. It is noted that the input buffer $432_{DQx}$ may represent any digit (e.g., bit) of data of the integrated circuit device 400A, where a value of x may represent a significance of the corresponding digit. For example, for eight digits of data, the integrated circuit device 400A may include eight input buffers $432_{DQ0}$-$432_{DQ7}$ of the same (e.g., similar) configuration as input buffer $432_{DQx}$ depicted in FIG. 4A.

The output $440_0$ of the input buffer $432_0$ and the output $440_{DQx}$ for each input buffer $432_{DQx}$ may be provided as inputs to a multiplexer 430. The multiplexer 430 may be in communication with, and controlled responsive to a control signal from, the calibration logic 126. The calibration logic 126 may be in communication with, and provide a control signal to, calibration circuitry $434_0$ for the input buffer $432_0$ and the calibration circuitry $434_{DQx}$ for each input buffer $432_{DQx}$. The control signals from the calibration logic 126 may each represent one or more discrete signals. The calibration circuitry 434 (e.g., $434_0$ and $434_{DQx}$) are depicted conceptually as variable current sources whose configuration will be more fully developed with reference to FIGS. 5A-5E. The calibration circuitry 434 for an input buffer 432 (e.g., $432_0$ or $432_{DQx}$) may be configured to adjust the offset of its input buffer 432. For example, it may restrict current flow in one or both legs of its input buffer 432, source current to one or both legs of its input buffer 432, and/or sink current from one or both legs of its input buffer 432, beyond what regulation might be provided by the voltage levels of the inputs of its input buffer 432.

Figure 4B:
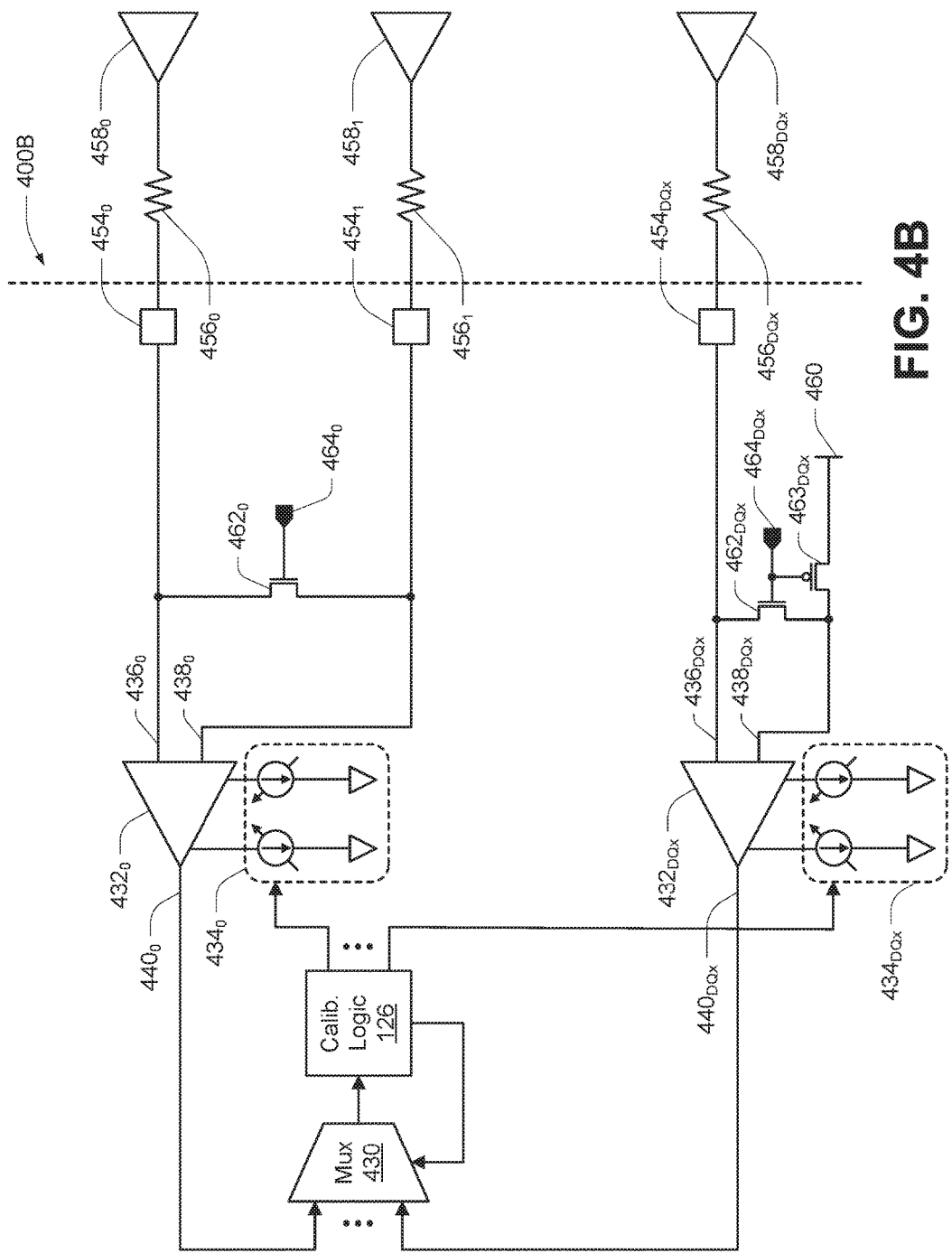
FIG. 4B is a block schematic of a portion of an integrated circuit device without on-die termination in accordance with another embodiment.

FIG. 4B is a block schematic of a portion of an integrated circuit device 400B (e.g., a memory device) without ODT in accordance with another embodiment. The integrated circuit device 400B may include the same structure described with reference to 400A for like-numbered elements, but without ODT devices 444 (e.g., ODT device $444_0$ and ODT device $444_{DQx}$). The integrated circuit device 400B may further includes a switch $462_0$ connected between the inputs $436_0$ and $438_0$ of the input buffer $432_0$ and responsive to a control signal received from a control signal node $464_0$. The switch $462_0$ is depicted in FIG. 4B as an nFET, but could include other means of selectively shorting the inputs $436_0$ and $438_0$ of the input buffer $432_0$. The integrated circuit device 400B may further includes a switch $462_{DQx}$ connected between the inputs $436_{DQx}$ and $438_{DQx}$ of the input buffer $432_{DQx}$ and responsive to a control signal received from a control signal node $464_{DQx}$. The switch $462_{DQx}$ is depicted in FIG. 4B as an nFET, but could include other means of selectively shorting the inputs $436_{DQx}$ and $438_{DQx}$ of the input buffer $432_{DQx}$. The integrated circuit device 400B may further includes a switch $463_{DQx}$ connected between the voltage node 460 and the input $436_{DQx}$ of the input buffer $432_{DQx}$. The switch $463_{DQx}$ is depicted in FIG. 4B as a pFET, but could include other means of selectively isolating the input $436_0$ of the input buffer $432_0$ from the voltage node 460, e.g., during calibration of buffer offset. In addition, although depicted to be responsive to the control signal received from the control signal node $464_{DQx}$, the switch $463_{DQx}$ might alternatively be responsive to a separate control signal. Furthermore, such means to selectively connect (e.g., short) the two inputs 436 and 438 of an input buffer 432, and/or to selectively isolate the input 436 from the voltage node 460 could be utilized in an embodiment of the type depicted if FIG. 4A utilizing ODT. For example, the switch $462_{DQx}$ of FIG. 4B could be connected between the inputs $436_{DQx}$ and $438_{DQx}$ of FIG. 4A, with the connection to the input $438_{DQx}$ occurring between the input buffer $432_{DQx}$ and the ODT device $444_{DQx}$.

Figure 4C:
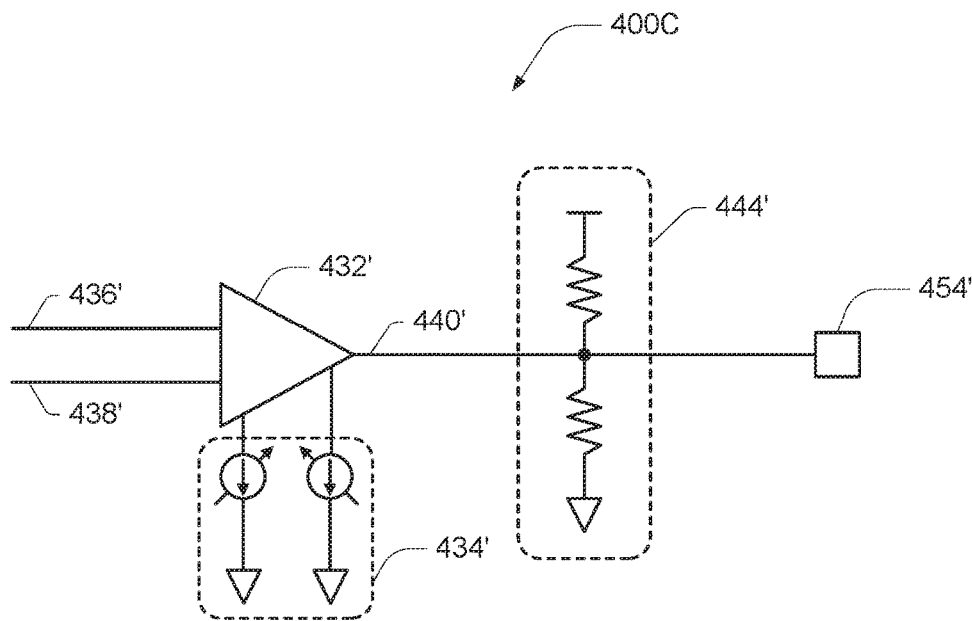
FIG. 4C is a block schematic of a portion of an integrated circuit device in accordance with a further embodiment.

FIG. 4C is a block schematic of a portion of an integrated circuit device 400C in accordance with a further embodiment. While the integrated circuit device 400C may include structure such as described with reference to FIGS. 4A-4B, the integrated circuit device 400C depicts an output buffer 432'. The output buffer 432' may have an output 440' configured to connect to a conductive node 454' (or other electrical connection for an external device) through ODT device 444'. The ODT device 444' may have a configuration similar to (e.g., the same as) the ODT device $444_0$ of FIG. 4A although resistance values of the pull-up resistance 448 and the pull-down resistance 450 may be different, either by design (e.g., as a result of ZQ calibration) or as a result variability in fabrication. Although the integrated circuit device 400C is depicted to include the ODT device 444' between the output buffer 432' and the conductive node 454', this could be eliminated.

The output buffer 432' may have a first input 436' and a second input 438'. The inputs 436' and 438' may be configured to receive complementary signals, similar to the input buffer $432_0$ of FIG. 4A, or the input 436' may be configured to receive a first signal, such as a data signal from the cache register 118, for example, and the input 438' may be configured to receive a reference voltage, such as Vrefq similar to the input buffer $432_{DQx}$ of FIG. 4A. The conductive node 454' might represent a physical contact for transmitting a signal to the I/O bus 134 of FIG. 1, for example. As a particular example, the conductive node 454' might be configured to transmit a data (DQ) signal, e.g., a signal representative of a digit of data, and may be a same conductive node as conductive node $454_{DQx}$, for example. In such an example, there may be an output buffer 432' corresponding to each input buffer $432_{DQx}$.

The input 436' and the input 438' might be configured to be selectively connected in a manner similar to that shown with respect to the inputs $436_0$ and $438_0$ of FIG. 4B using the switch $462_0$, or in a manner similar to that shown with respect to the inputs $436_{DQx}$ and $438_{DQx}$ of FIG. 4B using the switch $462_{DQx}$, while might further include being configured to selectively isolate the input 438' from a reference voltage, e.g., using the switch $463_{DQx}$.

The output 440' for each output buffer 432' may be provided as inputs to the multiplexer 430 along with the output 440$_{DQx}$ for each input buffer 432$_{DQx}$. Alternatively, a separate multiplexer might be used, also in communication with, and controlled responsive to a control signal from, the calibration logic 126. The calibration logic 126 may be in communication with, and provide a control signal to, calibration circuitry 434' for each output buffer 432'.

Figure 4D:
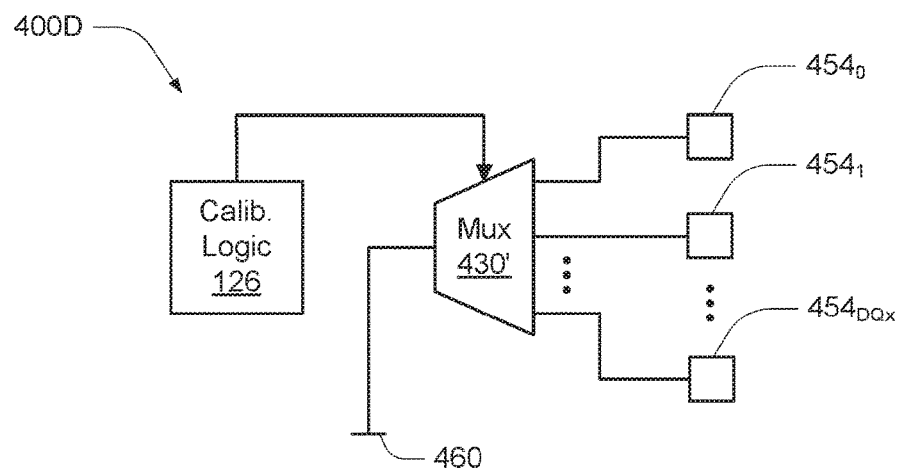
FIG. 4D is a block schematic of a portion of an integrated circuit device in accordance with a further embodiment.

FIG. 4D is a block schematic of a portion of an integrated circuit device 400D in accordance with a further embodiment. While the integrated circuit device 400D may include structure such as described with reference to FIGS. 4A-4B, the integrated circuit device 400D depicts an example of circuitry to apply a particular voltage level to a select conductive node 454 responsive to the calibration logic 126. For example, the multiplexer 430' could selectively connect the conductive node 454$_0$, the conductive node 454$_1$ or any of the conductive nodes 454$_{DQx}$ to the voltage node 460 to selectively receive the voltage level Vrefq.

Figure 5A:
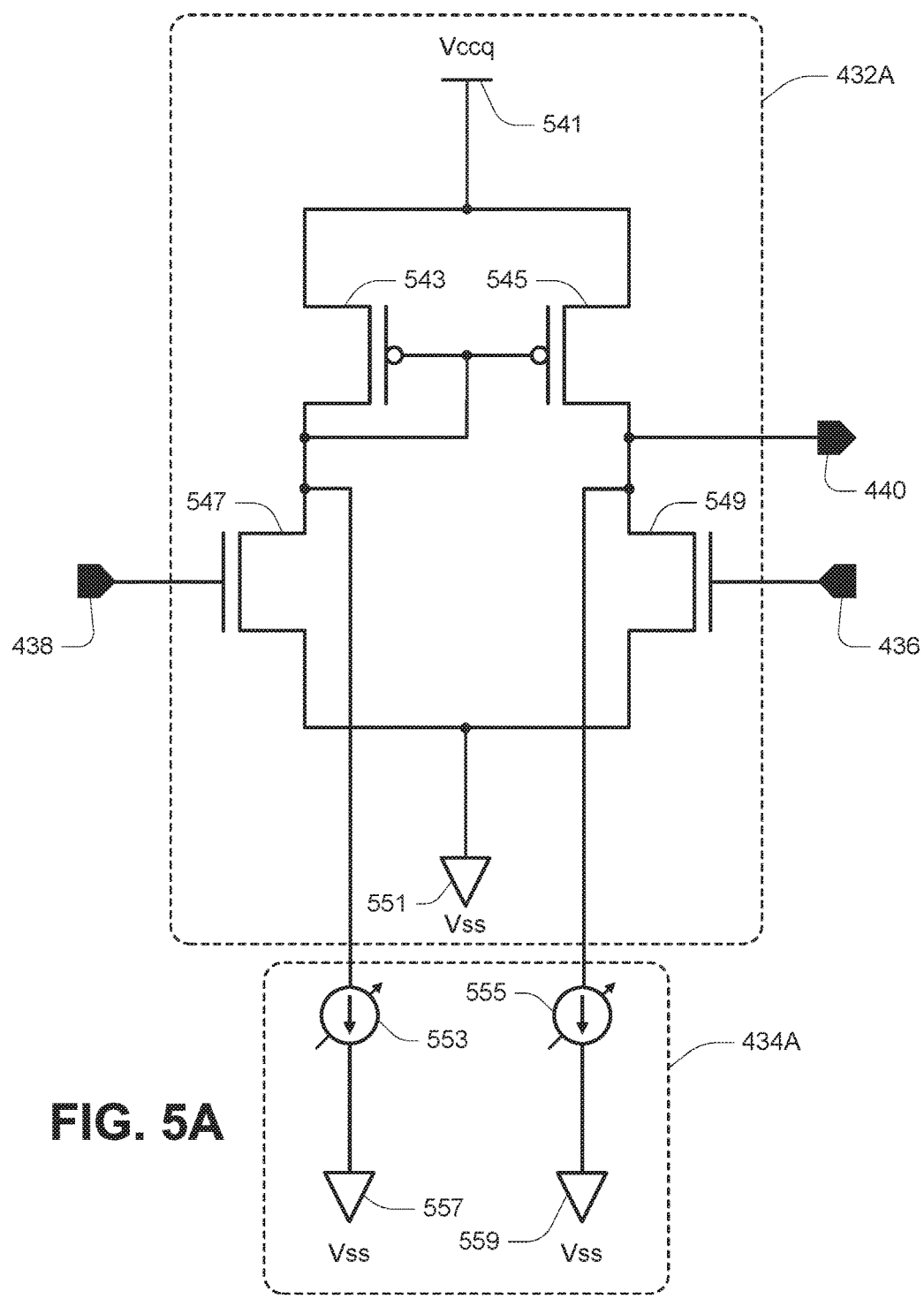
FIGS. 5A-5E depict various examples of representative structures and connections of calibration circuitry and input buffers in accordance with embodiments.

FIGS. 5A-5E depict various examples of representative structures and connections of calibration circuitry and I/O buffers in accordance with embodiments. In FIG. 5A, the I/O buffer 432A is depicted as a differential amplifier and having a first leg (e.g., a reference leg) with a current path including the FETs 543 and 547 connected in series between a voltage node 541 and a voltage node 551, and a second leg (e.g., an output leg) with a current path including the FETs 545 and 549 connected in series between the voltage node 541 and the voltage node 551. The voltage node 541 may be configured to receive a supply voltage Vccq, which may have a voltage level similar to (e.g., equal to) the supply voltage Vcc. The voltage node 551 may be configured to receive a reference potential, such as Vss or ground. The current path of the first leg of the I/O buffer 432A may be regulated (e.g., at least in part) by a voltage level of the input 438. The current path of the second leg of the I/O buffer 432A may be regulated (e.g., at least in part) by a voltage level of the input 436.

The FETs 547 and 549 are depicted as nFETs, while the FETs 543 and 545 are depicted as pFETs. However, reversal (e.g., n-type to p-type and p-type to n-type) of these depictions can be utilized, which may also be accompanied by a reversal of the voltage levels of the voltage nodes 541 and 551. In addition, the nFETs 547 and 549 may be designed to be of the same size, e.g., W/L, and construction, such that they may be expected to provide the same operating characteristics when receiving the same voltages to their respective control gates. Likewise, the pFETs 543 and 545 may be designed to be of the same size, e.g., W/L, and construction, such that they may be expected to provide the same operating characteristics when receiving the same voltages to their respective control gates.

The nFET 547 has its control gate connected to the second input 438 of the I/O buffer 432A, while the nFET 549 has its control gate connected to the first input 436 of the I/O buffer 432A. The control gates of the pFETs 543 and 545 are connected to a source/drain (e.g., drain) of the pFET 543, and thus configured as a current mirror.

The calibration circuitry 434A includes a first variable current device 553 connected between the first leg of the I/O buffer 432A and a voltage node 557, that may be configured to receive a reference potential, such as Vss or ground. In this configuration, the variable current device 553 is configured to selectively sink current from the first leg of the I/O buffer 432A, e.g., from a source/drain (e.g., drain) of the nFET 547, and thus from the control gates of the pFETs 543 and 545. In effect, the variable current device 553 is configured to selectively sink current from a current path regulated by the input 438. This might be used to mitigate buffer offset when the effective voltage at the control gate of the nFET 547 is lower than the effective voltage at the control gate of the nFET 549 when both receive the same applied voltage level.

The calibration circuitry 434A further includes a second variable current device 555 connected between the second leg of the I/O buffer 432A and a voltage node 559, that may be configured to receive a reference potential, such as Vss or ground. In this configuration, the variable current device 555 is configured to selectively sink current from the second leg of the I/O buffer 432A, e.g., from the output 440. In effect, the variable current device 555 is configured to selectively sink current from a current path regulated by the input 436. This might be used to mitigate buffer offset when the effective voltage at the control gate of the nFET 547 is higher than the effective voltage at the control gate of the nFET 549 when both receive the same applied voltage level.

Figure 5B:
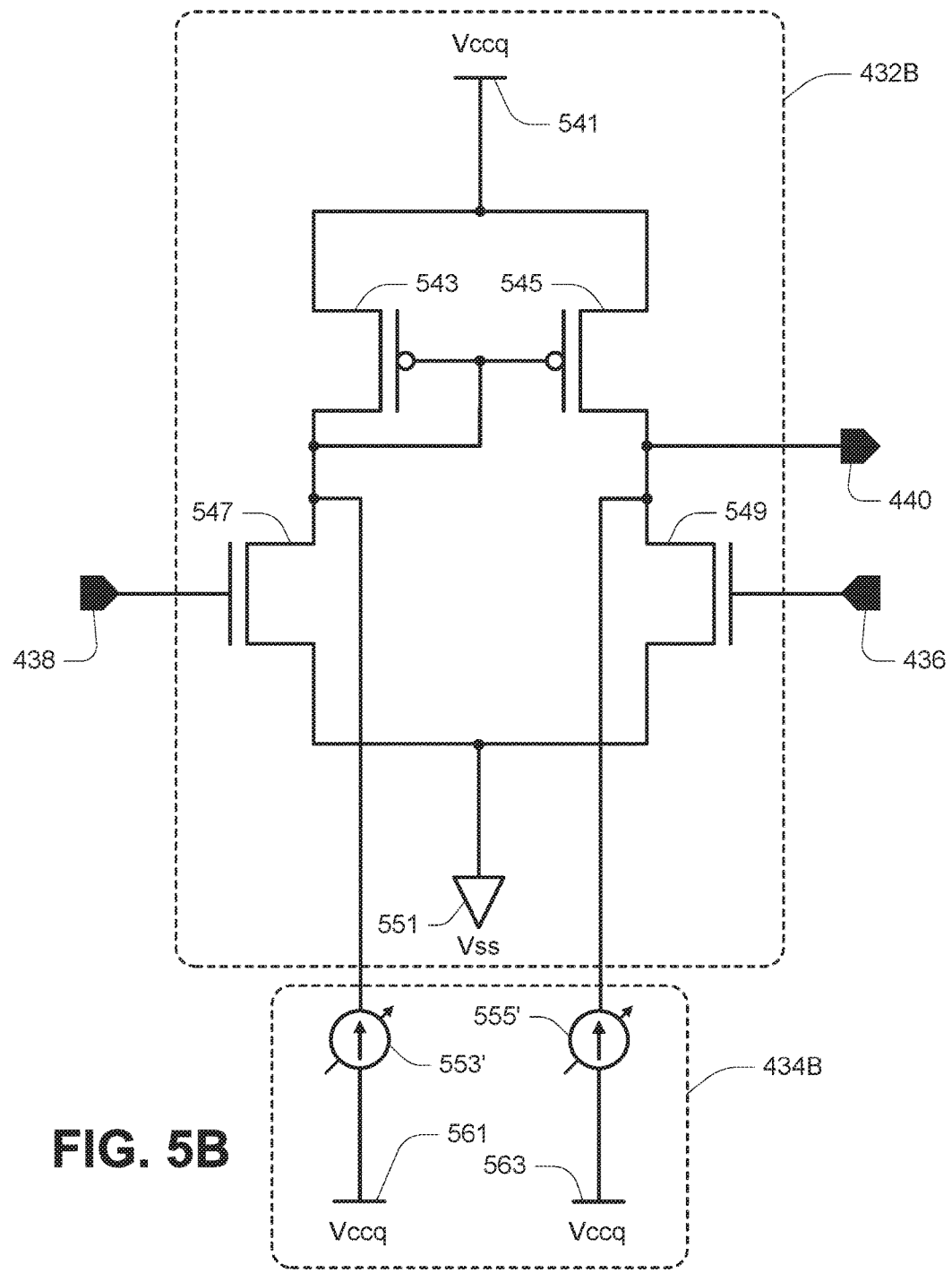

The I/O buffer 432B of FIG. 5B is depicted to utilize the same general structure of the differential amplifier as the I/O buffer 432A of FIG. 5A. However, the calibration circuitry 434B includes a first variable current device 553' connected between the first leg of the I/O buffer 432B and a voltage node 561, that may be configured to receive a supply voltage, such as Vccq. In this configuration, the variable current device 553' is configured to selectively source current to the first leg of the I/O buffer 432B, e.g., to a source/drain (e.g., drain) of the nFET 547, and thus to the control gates of the pFETs 543 and 545. In effect, the variable current device 553' is configured to selectively source current to a current path regulated by the input 438. This might be used to mitigate buffer offset when the effective voltage at the control gate of the nFET 547 is higher than the effective voltage at the control gate of the nFET 549 when both receive the same applied voltage level.

The calibration circuitry 434B further includes a second variable current device 555' connected between the second leg of the I/O buffer 432B and a voltage node 563, that may be configured to receive a supply voltage, such as Vccq. In this configuration, the variable current device 555 is configured to selectively source current to the second leg of the I/O buffer 432B, e.g., to the output 440. In effect, the variable current device 555' is configured to selectively source current to a current path regulated by the input 436. This might be used to mitigate buffer offset when the effective voltage at the control gate of the nFET 547 is lower than the effective voltage at the control gate of the nFET 549 when both receive the same applied voltage level.

Figure 5C:
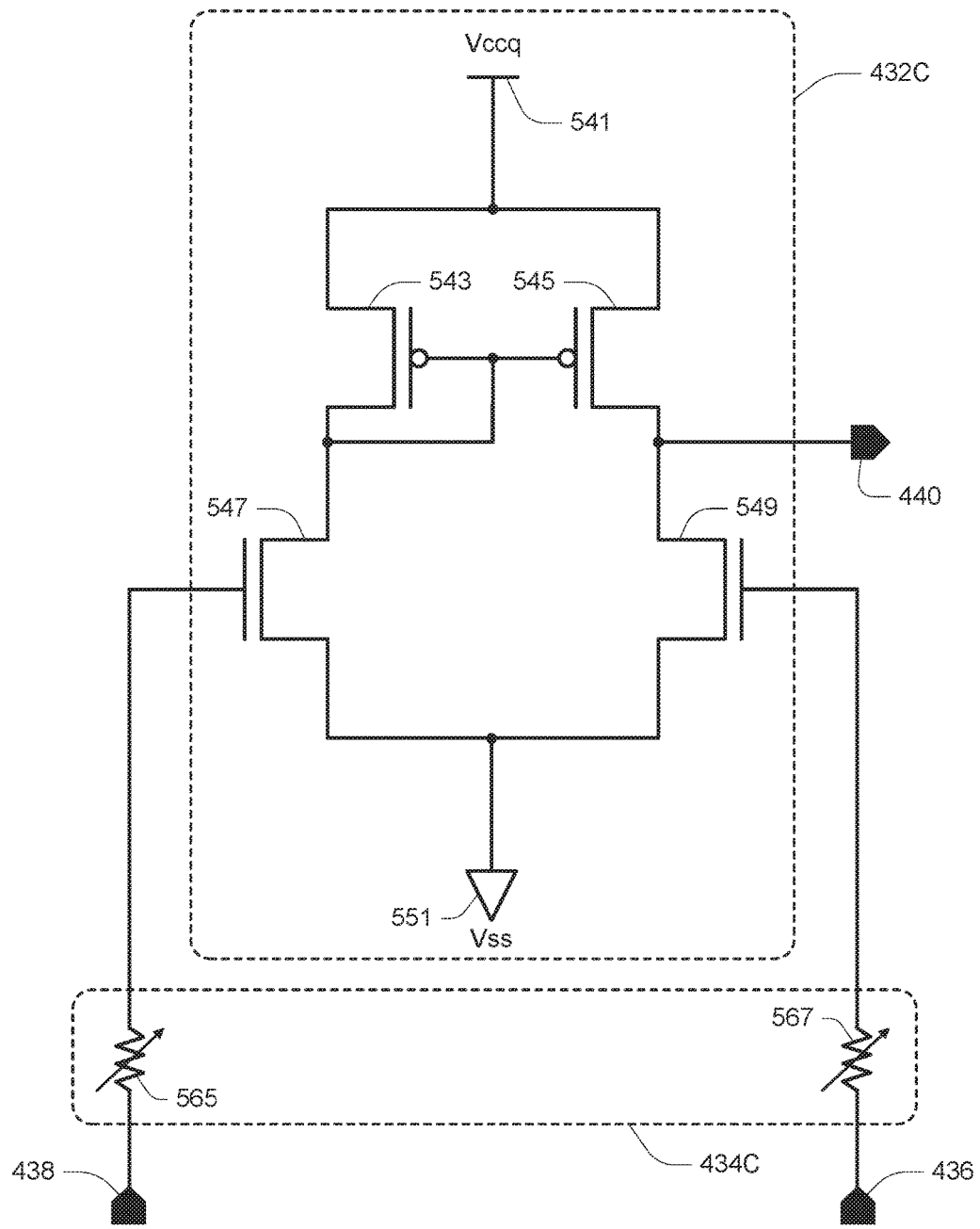

The I/O buffer 432C of FIG. 5C is depicted to utilize the same general structure of the differential amplifier as the I/O buffer 432A of FIG. 5A. However, the calibration circuitry 434C includes a first variable resistance 565 connected between the input 438 of the I/O buffer 432C and the control gate of the nFET 547. In this configuration, the variable resistance 565 is configured to selectively increase the resistance to the control gate of the nFET 547, and thus to selectively reduce the effective voltage of the input 438. In effect, the variable resistance 565 is configured to selectively adjust (e.g., increase) a resistance of the input 438. This might be used to mitigate buffer offset when the effective voltage at the control gate of the nFET 547 is higher than the effective voltage at the control gate of the nFET 549 when both receive the same applied voltage level.

The calibration circuitry 434C further includes a second variable resistance 567 connected between the input 436 of the I/O buffer 432C and the control gate of the nFET 549. In this configuration, the variable resistance 567 is configured to selectively increase the resistance to the control gate of the nFET 549, and thus to selectively reduce the effective voltage of the input 436. In effect, the variable resistance 567 is configured to selectively adjust (e.g., increase) a resistance of the input 436. This might be used to mitigate buffer offset when the effective voltage at the control gate of the nFET 547 is lower than the effective voltage at the control gate of the nFET 549 when both receive the same applied voltage level.

Figure 5D:
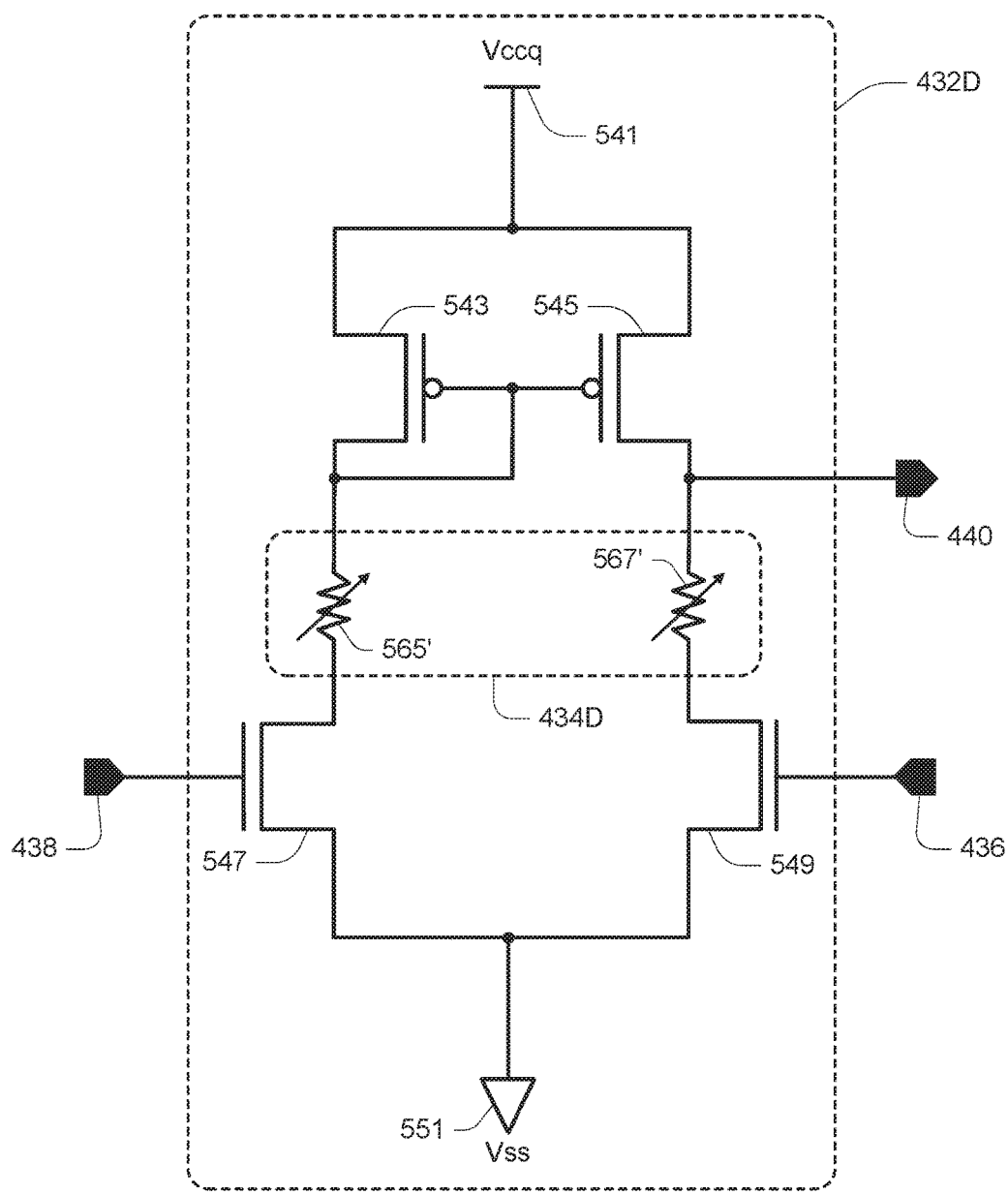

The I/O buffer 432D of FIG. 5D is depicted to utilize the same general structure of the differential amplifier as the I/O buffer 432A of FIG. 5A. However, the calibration circuitry 434D includes a first variable resistance 565' connected in the first leg of the I/O buffer 432D, e.g., between a source/drain (e.g., drain) of the nFET 547 and the control gates of the pFETs 543 and 545. In this configuration, the variable resistance 565' is configured to selectively adjust (e.g., increase) the resistance between the source/drain (e.g., drain) of the nFET 547 and the control gates of the pFETs 543 and 545, and thus to selectively reduce the effective voltage of the input 438. In effect, the variable resistance 565' is configured to selectively adjust (e.g., increase) a resistance of a current path regulated by the input 438. This might be used to mitigate buffer offset when the effective voltage at the control gate of the nFET 547 is higher than the effective voltage at the control gate of the nFET 549 when both receive the same applied voltage level.

The calibration circuitry 434D further includes a second variable resistance 567' connected in the second leg of the I/O buffer 432D, e.g., between a source/drain (e.g., drain) of the nFET 549 and the output 440. In this configuration, the variable resistance 567' is configured to selectively adjust (e.g., increase) the resistance between the source/drain (e.g., drain) of the nFET 549 and the output 440, and thus to selectively reduce the effective voltage of the input 436. In effect, the variable resistance 567' is configured to selectively adjust (e.g., increase) a resistance of a current path regulated by the input 436. This might be used to mitigate buffer offset when the effective voltage at the control gate of the nFET 547 is lower than the effective voltage at the control gate of the nFET 549 when both receive the same applied voltage level.

Figure 5E:
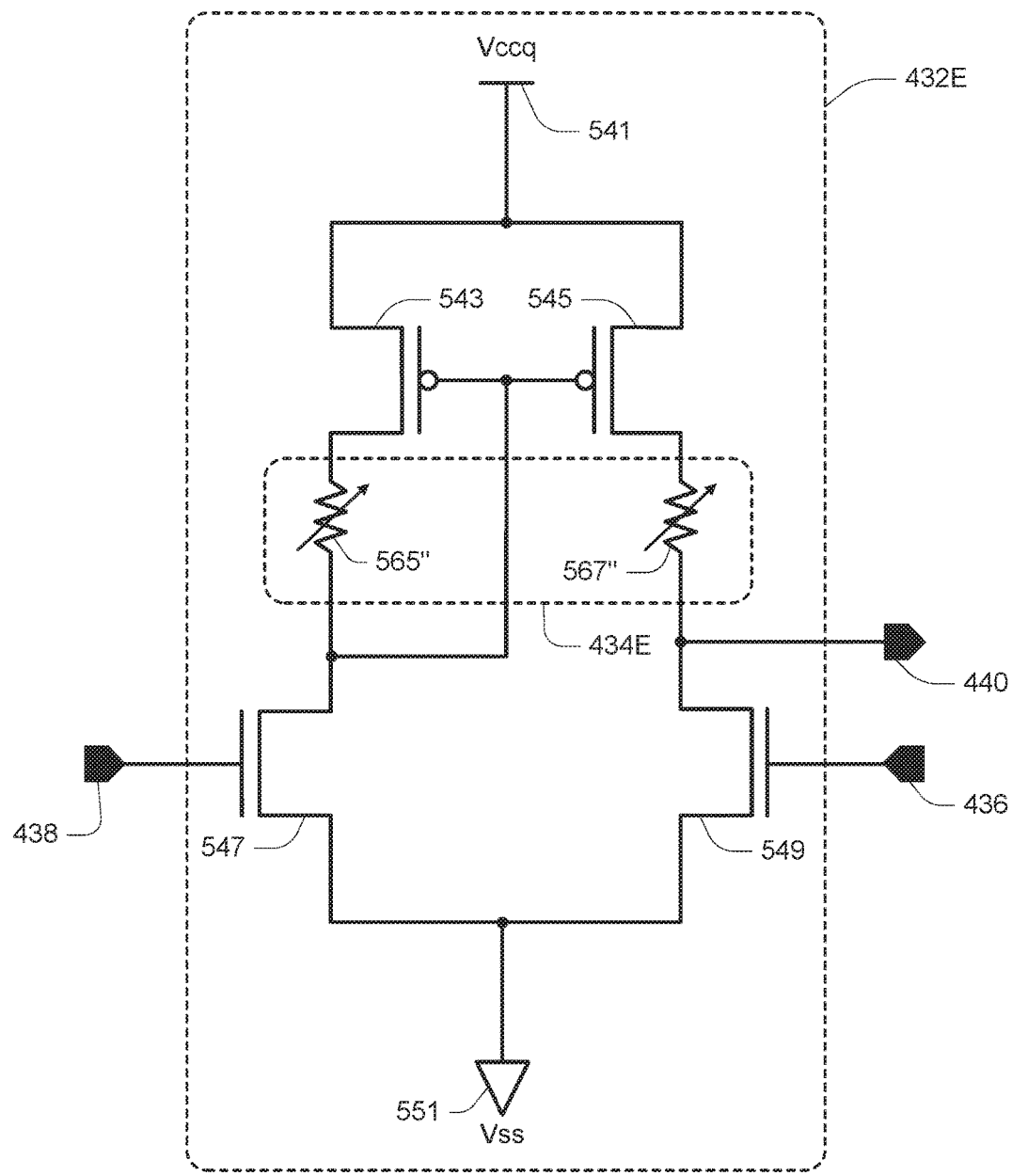

The I/O buffer 432E of FIG. 5E is depicted to utilize the same general structure of the differential amplifier as the I/O buffer 432A of FIG. 5A. However, the calibration circuitry 434E includes a first variable resistance 565" connected in the first leg of the I/O buffer 432E, e.g., between a source/drain (e.g., drain) of the pFET 543 and the control gates of the pFETs 543 and 545. In this configuration, the variable resistance 565" is configured to selectively adjust (e.g., increase) the resistance between the source/drain (e.g., drain) of the pFET 543 and the control gates of the pFETs 543 and 545, and thus to selectively adjust (e.g., increase) the effective voltage of the input 438. In effect, the variable resistance 565" is configured to selectively adjust (e.g., increase) a resistance of a current path regulated by the input 438. This might be used to mitigate buffer offset when the effective voltage at the control gate of the nFET 547 is lower than the effective voltage at the control gate of the nFET 549 when both receive the same applied voltage level.

The calibration circuitry 434E further includes a second variable resistance 567" connected in the second leg of the I/O buffer 432E, e.g., between a source/drain (e.g., drain) of the pFET 545 and the output 440. In this configuration, the variable resistance 567" is configured to selectively adjust (e.g., increase) the resistance between the source/drain (e.g., drain) of the pFET 545 and the output 440, and thus to selectively increase the effective voltage of the input 436. In effect, the variable resistance 567" is configured to selectively adjust (e.g., increase) a resistance of a current path regulated by the input 436. This might be used to mitigate buffer offset when the effective voltage at the control gate of the nFET 547 is higher than the effective voltage at the control gate of the nFET 549 when both receive the same applied voltage level.

While the examples of FIGS. 5A-5E depicted the various calibration circuitry 434 to utilize the same components in both legs of their respective I/O buffers 432, any combination of components facilitating corrective action regardless of which leg of the I/O buffer 432 exhibits the greater effective voltage might be utilized. For example, the variable current device 553 of FIG. 5A and the variable current device 553' might both be used in a first leg of an I/O buffer 432. In this manner, current could be sinked from the first leg of the I/O buffer 432 when the effective voltage at the control gate of the nFET 547 is lower than the effective voltage at the control gate of the nFET 549 when both receive the same applied voltage level, and current could be sourced to the first leg of the I/O buffer 432 when the effective voltage at the control gate of the nFET 547 is higher than the effective voltage at the control gate of the nFET 549 when both receive the same applied voltage level.

Figure 6:
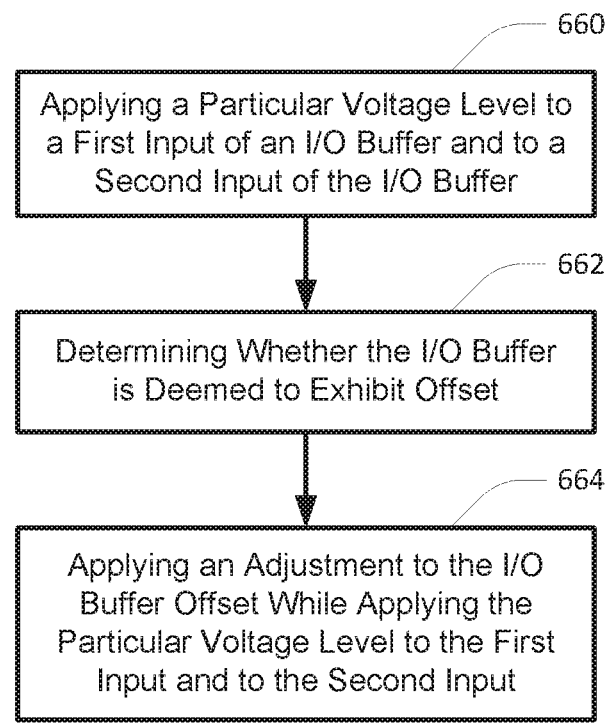
FIG. 6 is a flowchart of a method of operating in integrated circuit device in accordance with an embodiment.

FIG. 6 is a flowchart of a method of operating an integrated circuit device in accordance with an embodiment. At 660, a particular voltage level is applied to a first input of an I/O buffer and to a second input of the I/O buffer. The particular voltage level might be a reference voltage, such as Vrefq, which might represent a voltage level between (e.g., halfway between) a voltage level representing a logic high output value of the I/O buffer, e.g., the supply voltage Vcc, and a voltage level representing a logic low output value of the I/O buffer, e.g., the reference potential Vss or ground. As an example, the particular voltage level might be Vcc/2. With reference to FIG. 4A, the particular voltage level might be applied to the conductive node $454_0$ if the input $436_0$ of the input buffer $432_0$ represents the first input of the I/O buffer, to the conductive node $454_1$ if the input $438_0$ of the input buffer $432_0$ represents the first input of the I/O buffer, or to the conductive node $454_{DQx}$ if the input $436_{DQx}$ of the input buffer $432_{DQx}$ represents the first input of the I/O buffer. As a further example, with reference to FIG. 4B, the particular voltage level might be applied to the conductive node $454_0$ while the inputs $436_0$ and $438_0$ of the input buffer $432_0$ are connected if the input $436_0$ of the input buffer $432_0$ represents the first input of the I/O buffer, to the conductive node $454_1$ while the inputs $436_0$ and $438_0$ of the input buffer $432_0$ are connected if the input $438_0$ of the input buffer $432_0$ represents the first input of the I/O buffer, or to the conductive node $454_{DQx}$ while the inputs $436_{DQx}$ and $438_{DQx}$ of the input buffer $432_{DQx}$ are connected if the input $436_{DQx}$ of the input buffer $432_{DQx}$ represents the first input of the I/O buffer. For purposes of the method of FIG. 7, either of the inputs 436 or 438 could represent the first input of the I/O buffer.

At 662, whether the I/O buffer exhibits offset may be determined. For example, if the output of the I/O buffer is indeterminate, e.g., having a voltage level between a voltage level representing a logic high output value and a voltage level representing a logic low output value, the I/O buffer may be deemed to not exhibit offset. Conversely, if the output of the I/O buffer is determinate, e.g., having a voltage level representing one defined logic level, such as a logic high output value, or having a voltage level representing a different defined logic level, such as a logic low output value, the I/O buffer may be deemed to exhibit offset.

At 664, an adjustment is applied to the I/O buffer offset while applying the particular voltage level to the first input of the I/O buffer and to the second input of the I/O buffer. Possible adjustments are discussed in more detail with respect to FIGS. 9A-9D. However, in general, the adjustments might seek to restrict current flow (e.g., increase a resistance) in a current path regulated by the first input of the I/O buffer, restrict current flow (e.g., increase a resistance) in a current path regulated by the second input of the I/O buffer, source current to a current path regulated by the first input of the I/O buffer, source current to a current path regulated by the second input of the I/O buffer, sink current from a current path regulated by the first input of the I/O buffer, and/or sink current from a current path regulated by the second input of the I/O buffer, beyond what regulation might be provided by the voltage levels of the first input or the second input of the I/O buffer.

The output state of the I/O buffer may provide guidance for an appropriate adjustment relative to the particular configuration of the I/O buffer. For example, in the input buffers 432 of FIGS. 5A-5E each configured as a differential amplifier, a logic high output value of the respective input buffer 432 may indicate that the current through the nFET 549 responsive to the voltage level of the input 436 is lower than the current through the nFET 547 responsive to the voltage level of the input 438. This may indicate a desire to sink current from the output 440 (e.g., FIG. 5A), source current between the FETs 543 and 547 (e.g., FIG. 5B), increase resistance to the control gate of nFET 547 (e.g., FIG. 5C), increase resistance between nFET 547 and the control gates of the pFETs 543 and 545 (e.g., FIG. 5D), or increase resistance between the output 440 and the pFET 545 (e.g., FIG. 5E). Each such adjustment might reduce a voltage level of the output 440 of the respective input buffer 432, and cause a transition of the logic level of the output 440.

Conversely, a logic low output value of the respective input buffer 432 may indicate that the current through the nFET 549 responsive to the voltage level of the input 436 is higher than the current through the nFET 547 responsive to the voltage level of the input 438. This may indicate a desire to sink current from a point between the FETs 543 and 547 (e.g., FIG. 5A), source current to the output 440 (e.g., FIG. 5B), increase resistance to the control gate of nFET 549 (e.g., FIG. 5C), increase resistance between the output 440 and the nFET 549 (e.g., FIG. 5D), or increase resistance between the pFET 543 and the control gate of the pFETs 543 and 545 (e.g., FIG. 5E).

Regardless of the nature of the adjustment, a magnitude of the adjustment may be varied (e.g., increased) from an initial value until a logic level of the output of the I/O buffer transitions. The transition of the output of the I/O buffer might be from one logic level to another, e.g., from a logic high output value to a logic low output value, or it might be from one logic level to an indeterminate logic level, e.g., having a voltage level that is not indicative of a defined logic level.

For embodiments using a variable resistance for the adjustment, the initial value might be no resistance (e.g., no added resistance) or some other nominal value. From the initial value of resistance, adjustments might proceed to increasing values of resistance provided by the variable resistance. As an example, a variable resistance might provide four levels of resistance, e.g., R0<R1<R2<R3. Such a variable resistance could be controlled responsive to two control signals, for example. These control signals might be provided by the calibration logic 126. Similarly, where a variable resistance of a calibration circuitry 434 is used in more than one instance, e.g., the variable resistance 565 and variable resistance 567 of FIG. 5C, separate sets of control signals might be provided to each instance of a variable resistance. Table 1 provides an example of a possible relationship between the logic levels of the control signals and the resistance of a variable resistance responsive to those control signals.

TABLE 1

| MSB | LSB | Resistance |
|---|---|---|
| 0 | 0 | R0 |
| 0 | 1 | R1 |
| 1 | 0 | R2 |
| 1 | 1 | R3 |

Similarly, for embodiments using a variable current device for the adjustment, the initial value might be no current (e.g., no added current) or some other nominal value. From this initial value of current, adjustments might proceed to increasing values of current provided by the variable current device. As an example, a variable current device might provide four levels of current, e.g., I0<I1<I2<I3, either sourced or sinked. Such a variable current device could be controlled responsive to two control signals, for example. These control signals might be provided by the calibration logic 126. Similarly, where a variable current device of a calibration circuitry 434 is used in more than one instance, e.g., the variable current device 554 and variable current device 555 of FIG. 5A, separate sets of control signals might be provided to each instance of a variable current device. Table 2 provides an example of a possible relationship between the logic levels of the control signals and the current of a variable current device responsive to those control signals.

TABLE 2

| MSB | LSB | Current |
|---|---|---|
| 0 | 0 | I0 |
| 0 | 1 | I1 |
| 1 | 0 | I2 |
| 1 | 1 | I3 |

While the foregoing examples of the relationship between control signals and resistance for a variable resistance, or current levels for a variable current device, utilized two binary control signals for each example, other numbers or values of control signals could be utilized.

Figure 7:
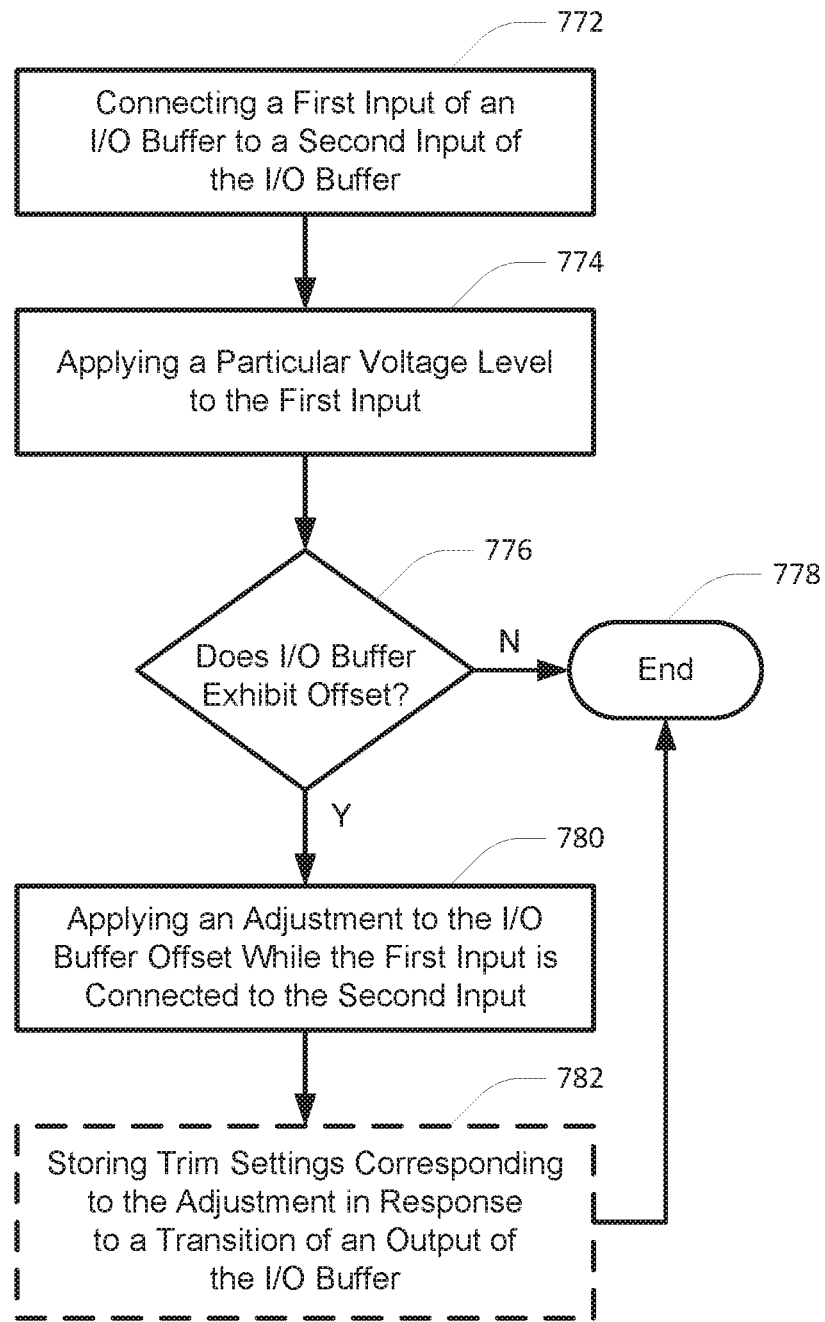
FIG. 7 is a flowchart of a method of operating in integrated circuit device in accordance with an embodiment.

FIG. 7 is a flowchart of a method of operating an integrated circuit device in accordance with a further embodiment. At 772, a first input of an input/output (I/O) buffer is connected to a second input of the I/O buffer. For example, with reference to FIG. 4B, the inputs $436_0$ and $438_0$ of the input buffer $432_0$ could be connected by activating the switch $462_0$, or the inputs $436_{DQx}$ and $438_{DQx}$ of the input buffer $432_{DQx}$ could be connected by activating the switch $462_{DQx}$. For purposes of the method of FIG. 7, either of the inputs 436 or 438 might represent the first input of the I/O buffer.

At 774, a particular voltage level is applied to the first input of the I/O buffer. The particular voltage level might be a reference voltage, such as Vrefq, which might represent a voltage level between (e.g., halfway between) a voltage level representing a logic high output value of the I/O buffer (e.g., the supply voltage Vcc) and a voltage level representing a logic low output value of the I/O buffer (e.g., the reference potential Vss or ground). As an example, the particular voltage level might be Vcc/2. With reference to FIG. 4B, the particular voltage level might be applied to the conductive node $454_0$ if the input $436_0$ of the input buffer $432_0$ represents the first input of the I/O buffer, to the conductive node $454_1$ if the input $438_0$ of the input buffer $432_0$ represents the first input of the I/O buffer, or to the conductive node $454_{DQx}$ if the input $436_{DQx}$ of the input buffer $432_{DQx}$ represents the first input of the I/O buffer. The particular voltage level might be applied by an external device, e.g., during testing of the integrated circuit device. Alternatively, the particular voltage level might be applied internally, e.g., responsive to the calibration logic 126.

At 776, whether the I/O buffer exhibits offset may be determined. For example, if the output of the I/O buffer is indeterminate, e.g., having a voltage level between a voltage level representing a logic high output value and a voltage level representing a logic low output value, the I/O buffer may be deemed to not exhibit offset. Conversely, if the output of the I/O buffer is determinate, e.g., having a voltage level representing one defined logic level, such as a logic high output value, or having a voltage level representing a different defined logic level, such as a logic low output value, the I/O buffer may be deemed to exhibit offset. If the I/O buffer is not deemed to exhibit offset, the process may end at 778. If the I/O buffer is deemed to exhibit offset, the process may continue at 780.

At 780, an adjustment is applied to the I/O buffer offset while the first input of the I/O buffer is connected to the second input of the I/O buffer. The adjustment may further be applied while applying the particular voltage level to the first input of the I/O buffer. Possible adjustments are discussed in more detail with respect to FIGS. 9A-9D. However, in general, the adjustments might seek to restrict current flow (e.g., increase a resistance) in a current path regulated by the first input of the I/O buffer, restrict current flow (e.g., increase a resistance) in a current path regulated by the second input of the I/O buffer, source current to a current path regulated by the first input of the I/O buffer, source current to a current path regulated by the second input of the I/O buffer, sink current from a current path regulated by the first input of the I/O buffer, and/or sink current from a current path regulated by the second input of the I/O buffer, beyond what regulation might be provided by the voltage levels of the first input or the second input of the I/O buffer.

As discussed with reference to FIG. 6, the output state of the I/O buffer may provide guidance for an appropriate adjustment relative to the particular configuration of the I/O buffer. Similarly, adjustments can be made in response to control signals, such as from the calibration logic 126.

Regardless of the control signals utilized to effect the adjustment, once the transition of the output of the I/O buffer is detected, trim settings corresponding to that adjustment could be stored at 782. The trim settings could be stored to a trim register 128 for subsequent use by the integrated circuit device, e.g., for mitigating buffer offset during normal operation of the I/O buffer.

Figure 8A:
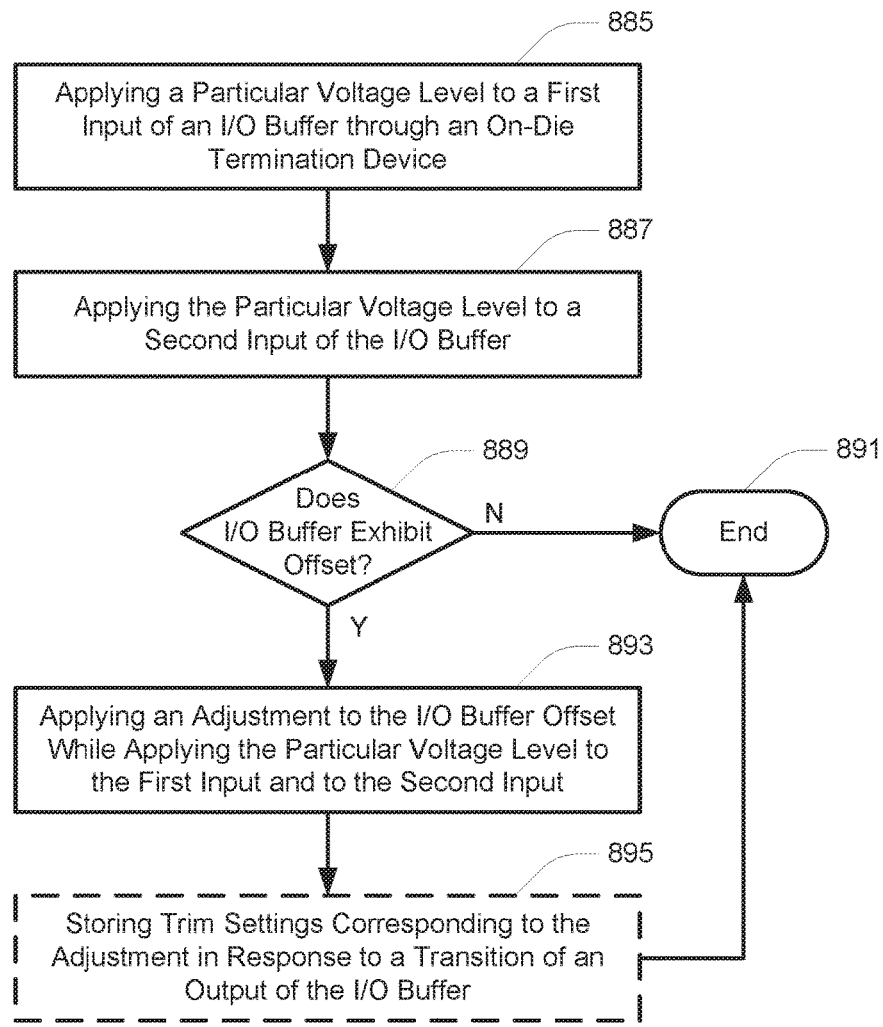
FIGS. 8A-8B are flowcharts of methods of operating in integrated circuit device in accordance with embodiments.

FIG. 8A is a flowchart of a method of operating in integrated circuit device in accordance with a further embodiment. At 885, a particular voltage level is applied to a first input of the I/O buffer through an ODT device. The particular voltage level might be a reference voltage, such as Vrefq, which might represent a voltage level between (e.g., halfway between) a voltage level representing a logic high output value of the I/O buffer, e.g., the supply voltage Vcc, and a voltage level representing a logic low output value of the I/O buffer, e.g., the reference potential Vss or ground. As an example, the particular voltage level might be Vcc/2. With reference to FIG. 4A, the particular voltage level might be applied to the conductive node $454_0$ if the input $436_0$ of the input buffer $432_0$ represents the first input of the I/O buffer, to the conductive node $454_1$ if the input $438_0$ of the input buffer $432_0$ represents the first input of the I/O buffer, or to the conductive node $454_{DQx}$ if the input $436_{DQx}$ of the input buffer $432_{DQx}$ represents the first input of the I/O buffer. In a specific example with reference to FIG. 4A, either the input $436_0$ or the input $438_0$ of the input buffer $432_0$ might represent the first input of the I/O buffer if the input buffer $432_0$ represents the I/O buffer. Similarly, if the input buffer $432_{DQx}$ represents the I/O buffer, the input $436_{DQx}$ of the input buffer $432_{DQx}$ might represent the first input of the I/O buffer.

Figure 8B:
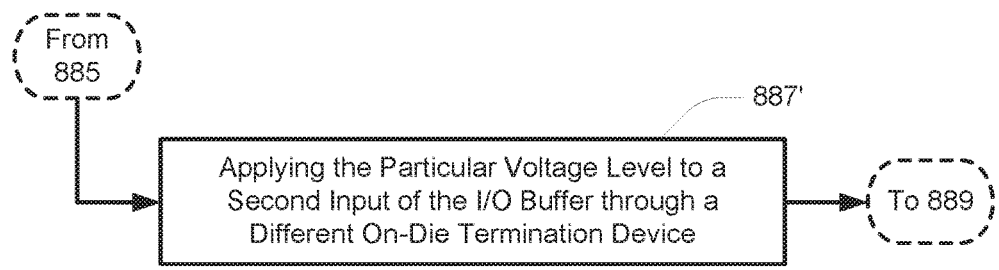

At 887, the particular voltage level is applied to the second input of the I/O buffer. As demonstrated in the option of FIG. 8B at 887', the particular voltage level might be applied to the second input of the I/O buffer through a different ODT device. In a specific example with reference to FIG. 4A, if the input buffer $432_0$ represents the I/O buffer and the input $436_0$ represents the first input of the I/O buffer, the input $438_0$ might represent the second input of the I/O buffer and the particular voltage level might be applied to the conductive node $454_1$. Conversely, if the input buffer $432_{DQx}$ of FIG. 4A represents the I/O buffer and the input $436_{DQx}$ represents the first input of the I/O buffer, the input $438_{DQx}$ might represent the second input of the I/O buffer and the particular voltage level might be applied to the voltage node 460, e.g., without passing through an ODT device.

At 889, whether the I/O buffer exhibits offset may be determined. For example, if the output of the I/O buffer is indeterminate, e.g., having a voltage level between a voltage level representing a logic high output value and a voltage level representing a logic low output value, the I/O buffer may be deemed to not exhibit offset. Conversely, if the output of the I/O buffer is determinate, e.g., having a voltage level representing a logic high output value or having a voltage level representing a logic low output value, the I/O buffer may be deemed to exhibit offset. If the I/O buffer is not deemed to exhibit offset, the process may end at 891. If the I/O buffer is deemed to exhibit offset, the process may continue at 893.

At 893, an adjustment is applied to the I/O buffer offset while applying the particular voltage level to the first input and to the second input of the I/O buffer, e.g., with or without passing through an ODT device such as discussed with reference to 887 and 887'. Possible adjustments are discussed in more detail with respect to FIGS. 9A-9D. However, in general, the adjustments might seek to restrict current flow (e.g., increase a resistance) in a current path regulated by the first input of the I/O buffer, restrict current flow (e.g., increase a resistance) in a current path regulated by the second input of the I/O buffer, source current to a current path regulated by the first input of the I/O buffer, source current to a current path regulated by the second input of the I/O buffer, sink current from a current path regulated by the first input of the I/O buffer, and/or sink current from a current path regulated by the second input of the I/O buffer, beyond what regulation might be provided by the voltage levels of the first input or the second input of the I/O buffer.

As discussed with reference to FIG. 6, the output state of the I/O buffer may provide guidance for an appropriate adjustment relative to the particular configuration of the I/O buffer. Similarly, adjustments can be made in response to control signals, such as from the calibration logic 126.

Regardless of the control signals utilized to effect the adjustment, once the transition of the output of the I/O buffer is detected, trim settings corresponding to that adjustment could be stored at 895. The trim settings could be stored to a trim register 128 for subsequent use by the integrated circuit device.

FIGS. 9A-9D are flowcharts of methods of operating in integrated circuit device in accordance with embodiments. Each of the FIGS. 9A-9D represents a particular type of adjustment that might be applied at 780 in FIG. 7 and/or 893 in FIG. 8A.

Figure 9A:
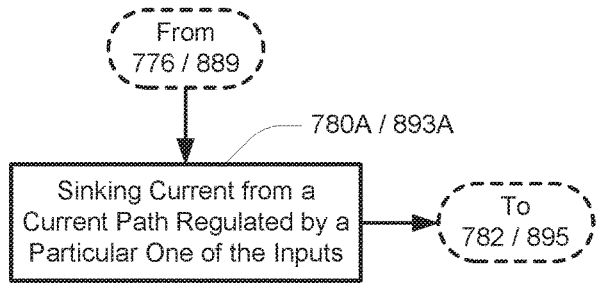
FIGS. 9A-9D are flowcharts of methods of operating in integrated circuit device in accordance with embodiments.

In FIG. 9A, a current may be sinked at 780A/893A from a current path regulated by a particular one of the inputs of the I/O buffer. For example, the variable current source 553 of FIG. 5A is configured to selectively sink current from a current path regulated by the input 438, while the variable current source 555 of FIG. 5A is configured to selectively sink current from a current path regulated by the input 436. As discussed with reference to FIG. 7, whether it may be desirable to sink current from one current path or the other might be indicated by an output value of the output 440.

Figure 9B:
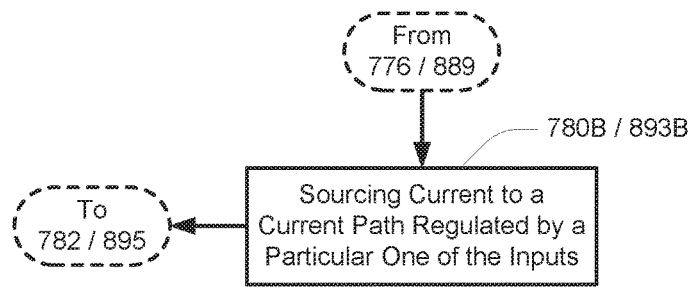

In FIG. 9B, a current may be sourced at 780B/893B to a current path regulated by a particular one of the inputs of the I/O buffer. For example, the variable current source 553' of FIG. 5B is configured to selectively source current to a current path regulated by the input 438, while the variable current source 555' of FIG. 5B is configured to selectively source current to a current path regulated by the input 436. As discussed with reference to FIG. 7, whether it may be desirable to source current to one current path or the other might be indicated by an output value of the output 440.

Figure 9C:
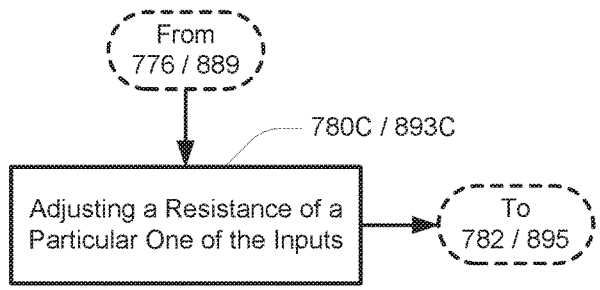

In FIG. 9C, a resistance of a particular one of the inputs of the I/O buffer may be adjusted (e.g., increased) at 780C/893C. For example, the variable resistance 565 of FIG. 5C is configured to selectively adjust a resistance of the input 438, while the variable resistance 567 of FIG. 5C is configured to selectively adjust a resistance of the input 436. As discussed with reference to FIG. 7, whether it may be desirable to adjust the resistance of one input or the other might be indicated by an output value of the output 440.

Figure 9D:
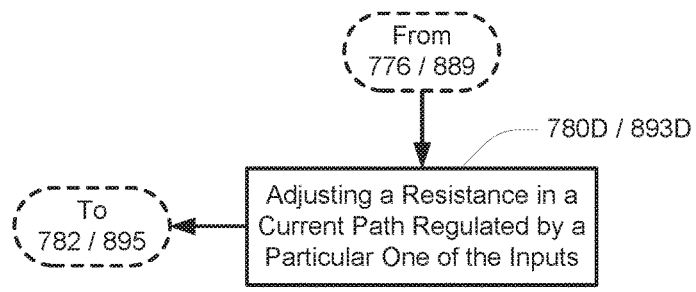

In FIG. 9D, a resistance in a current path regulated by a particular one of the inputs of the I/O buffer may be adjusted (e.g., increased) at 780D/893D. For example, the variable resistance 565' of FIG. 5D is configured to selectively adjust a resistance in a current path regulated by the input 438, while the variable resistance 567' of FIG. 5D is configured to selectively adjust a resistance in a current path regulated by the input 436. For another example, the variable resistance 565" of FIG. 5E is configured to selectively adjust a resistance in a current path regulated by the input 438, while the variable resistance 567" of FIG. 5E is configured to selectively adjust a resistance in a current path regulated by the input 436. As discussed with reference to FIG. 7, whether it may be desirable to adjust the resistance in one current path or the other, for each location of that resistance, might be indicated by an output value of the output 440.

For embodiments utilizing ODT, the adjustments of buffer offset described with reference to FIGS. 6, 7, 8A-8B and/or 9A-9D may be performed after each relevant ODT device has been calibrated to a particular impedance. In addition, the methods disclosed might be performed in sequence for multiple I/O buffers. For example, with reference to FIGS. 4A-4B, adjustment of buffer offset may be performed in a sequence by connecting (e.g., though the multiplexer 430) an output 440 of one I/O buffer 432 to the calibration logic 126 and performing a method of FIGS. 6, 7, 8A-8B and/or 9A-9D, and then repeating that process for each subsequent I/O buffer 432. The methods may be performed during testing following fabrication (e.g., prior to packaging), in response to a received command, in response to a schedule (e.g., based on either elapsed time or a number of operations performed), in response to a change in the integrated circuit device (e.g., calibration of ODT devices), or in response to a predefined condition (e.g., in response to a power-up event).

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating an integrated circuit device, comprising:
   applying a particular voltage level to a first input of an input/output (I/O) buffer and to a second input of the I/O buffer;
   determining whether the I/O buffer is deemed to exhibit offset; and
   applying an adjustment to the I/O buffer offset while applying the particular voltage level to the first input of the I/O buffer and to the second input of the I/O buffer if the I/O buffer is deemed to exhibit offset;
   wherein applying the particular voltage level to the first input of the I/O buffer and to the second input of the I/O buffer comprises:
      connecting the first input of the I/O buffer to the second input of the I/O buffer; and
      applying the particular voltage level to the first input of the I/O buffer while the first input of the I/O buffer is connected to the second input of the I/O buffer.

2. The method of claim 1, wherein the I/O buffer is an input buffer, and wherein applying the particular voltage level of the first input of the I/O buffer comprises applying the particular voltage level to a conductive node of the integrated circuit device configured for connection to a device external to the integrated circuit device.

3. The method of claim 1, further comprising:
   while applying the particular voltage level to the first input of the I/O buffer, isolating the second input of the I/O buffer from a voltage node.

4. A method of operating an integrated circuit device, comprising:
   connecting a first input of an input buffer of the integrated circuit device to a second input of the input buffer;
   applying a particular voltage level to the first input of the input buffer;
   determining whether the I/O buffer is deemed to exhibit offset;
   applying an adjustment to the I/O buffer offset while the first input of the input buffer is connected to the second input of the input buffer if the input buffer is deemed to exhibit offset;
   increasing a magnitude of the adjustment until a logic level of an output of the input buffer transitions; and in response to the transition, storing trim settings for the integrated circuit device corresponding to the adjustment resulting in the transition.

5. The method of claim 4, further comprising:

while applying the particular voltage level to the first input of the input buffer, isolating the second input of the input buffer from a voltage node.

* * * * *